United States Patent [19]
Lee et al.

[11] Patent Number: 6,064,622
[45] Date of Patent: May 16, 2000

[54] COLUMN SELECT LINE CONTROL CIRCUIT FOR SYNCHRONOUS SEMICONDUCTOR MEMORY DEVICE AND ASSOCIATED METHODS

[75] Inventors: Hi-Choon Lee; Seung-Cheol Oh, both of Kyunggi-do, Rep. of Korea

[73] Assignee: Samsung Electronics Co., Ltd., Suwon, Rep. of Korea

[21] Appl. No.: 09/221,827

[22] Filed: Dec. 28, 1998

[30] Foreign Application Priority Data

Dec. 26, 1997 [KR] Rep. of Korea .................. 97-74207

[51] Int. Cl.[7] ..................................... G11C 8/00
[52] U.S. Cl. ................ 365/230.06; 365/210; 365/233
[58] Field of Search ........................ 365/230.06, 233, 365/210, 230.03

[56] References Cited

U.S. PATENT DOCUMENTS

| | | | |
|---|---|---|---|
| 5,629,903 | 5/1997 | Agata | 365/230.06 |
| 5,790,470 | 8/1998 | Yonaga | 365/230.06 |
| 5,898,637 | 4/1999 | Lakhani et al. | 365/230.06 |
| 5,933,376 | 8/1999 | Lee | 365/200 |

*Primary Examiner*—Son T. Dinh
*Attorney, Agent, or Firm*—Jones Volentine, L.L.P.

[57] ABSTRACT

A synchronous memory includes a column main-decoder circuit that is directly coupled to column select lines (CSL), and a timing controller that controls both enable timing and disable timing of the column select lines by controlling the column pre-decoder. The CSL timing controller generates a CSL timing control signal representative of the enable timing and the disable timing of the column select lines. The column pre-decoder is either enabled or disabled depending upon logic states of the CSL timing control signal. The timing controller includes a first control circuit which provides a CSL enable control signal, a CSL disable control circuit which provides a CSL disable control signal, and a flip-flop circuit which receives the CSL enable and disable control signals and provides the CSL timing control signal.

8 Claims, 10 Drawing Sheets

200a'

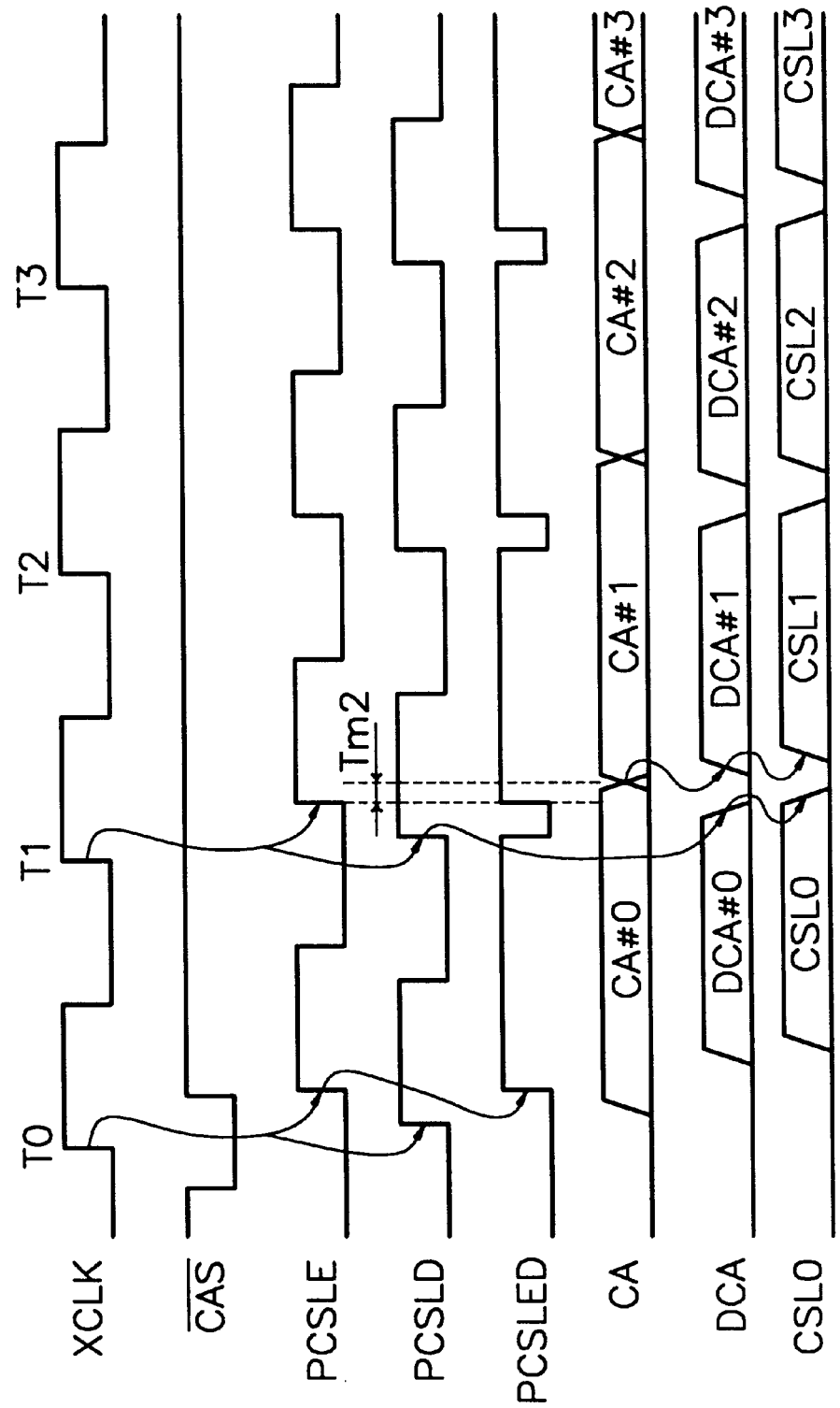

COLUMN SELECT LINE CONTROL CIRCUIT FOR SYNCHRONOUS SEMICONDUCTOR MEMORY DEVICE AND ASSOCIATED METHODS

CROSS-REFERENCES TO RELATED APPLICATIONS

The present application claims priority under 35 U.S.C. §119 to Korean Patent Application No. 97-74207 filed on Dec. 26, 1997, the entire contents of which are hereby incorporated by reference for all purposes.

BACKGROUND OF THE INVENTION

1. Field of the Invention

The present invention relates generally to integrated circuit semiconductor memory devices and associated methods. In particular, the present invention relates to a column select line (CSL) control for which the same signal controls the enable timing and the disable timing signals for synchronous random access memory devices.

2. Description of Related Art

Speed improvements in semiconductor memory devices, such as Dynamic RAMs and Static RAMs, have historically come from process and photolithography advances. More recent memory speed improvements, however, have resulted mainly from making changes to the base architecture. An example of fast RAM architecture is the synchronous architecture. One key advancement of the synchronous memories is their ability to synchronously burst data at a high-speed data rate. Additionally, in a system with a synchronous RAM, since data, addresses and control signals are latched into the memory in synchronism with the system's clock signal, the system's processor is able to perform other tasks freely until data is available after a known number of clock cycles. This architecture provides substantial advantages in memory operating performance.

In a typical semiconductor memory device, in order to write/read data into/from a specific memory cell in a memory device, the specific memory cell should be designated by a row address and a column address. When the specific memory cell is designated in a read/write operation, a charge distribution operation is performed with respect to data read out from the designated memory cell to a bit line, and the readout data is amplified by a sense amplifier. The amplified data is transmitted to an input/output line through an I/O gate circuit, and then is output from the memory chip via associated output circuits. The read operation of one-bit data stored in the specific memory cell is completed by the above-described process. The column decoder turns on the selected I/O gate by receiving and decoding the column address.

To simplify the complexity of the decoding operation in highly integrated memories, a column pre-decoder is typically provided to pre-decode the column address prior to the main decoding operation therefor. This column decoding scheme has been adopted in most high density memory devices.

FIG. 1 is a block diagram illustrating a conventional exemplary synchronous memory device. Referring to FIG. 1, an array 100 of memory cells is provided to store data. Word lines WL0–WLm and bit lines BL0–BLn coupled with the cells run along the rows and columns of the memory cell array 100, respectively. In the vicinity of the cell array 100, a row decoder 120 is provided for selectively driving the word lines WL0–WLm, and an input/output (I/O) gate circuit 140 for supporting the selective transmission of data from the bit lines BL0–BLn to a data I/O buffer 280, and vice versa. The I/O gate circuit 140 is controlled by column select lines CSL0–CSLn. Externally applied address signals A0–Ax including both column and row address signals are fed to an address buffer 160. The column address signals CA0–CAi among the address inputs are applied to a column pre-decoder 180.

A clock buffer 230 is suppled with an external clock signal XCLK and provides an internal PCLK synchronized with the external clock signal XCLK. A CSL enable control circuit 240 generates a CSL enable control clock signal PCSLE by the logical combination of the internal clock signal PCLK and a column address setting signal PYE from a timing control logic (not seen). The column pre-decoder 180 pre-decodes the column address signals CA0–CAi and generates pre-decoded address signals DCA0–DCAj.

The column pre-decoder 180 outputs the DCA0–DCAj signals under the control of the PCSLE signal from the CSL enable control circuit 240. Main decoding operation of the column address signals are then carried out by a column main-decoder 200. This decoder 200 generates decoded signals DCAB0–DCABk by decoding the DCA0–DCAj. The DCAB0–DCABk signals are provided to a column driver 220 which drives the column select lines CSL0–CSLn selectively in response to the DCAB0–DCABk signals. A CSL disable control circuit 260 generates a CSL disable control clock signal PCSLD by the logical combination of the internal clock signal PCLK and a normally logic-high signal PVCCH. The column driver 220 is disabled by the PCSLD signal from the CSL disable control circuit 260, and hence stops driving the column select lines CSL0–CSLn.

FIGS. 2A and 2B illustrate the constructions of the CSL enable and disable control circuits 240 and 260, respectively, in detail. Referring first to FIG. 2A, the CSL enable control circuit 240 includes a delay circuit formed by inverters IV1–IV4 ("first" delay circuit), a NAND gate G1, and an inverter IV5. The internal clock signal PCLK is provided to the delay circuit. The NAND gate G1 has one input applied with the delayed signal of the clock signal PCLK and the other input applied with the column address setting signal PYE. The output signal of the NAND gate G1 is output through the inverter IV5 as the CSL enable control clock signal PCSLE.

Referring to FIG. 2B, the CSL disable control circuit 260 includes a delay circuit formed by inverters IV6–IV8 ("second" delay circuit) and a NAND gate G2. The second delay circuit is also fed with the clock signal PCLK. This delay circuit has a smaller delay time than the first delay circuit. The output of the second delay circuit is supplied to one input of the NAND gate G2. The normally logic-high signals PVCCH is provide to the other input of the NAND gate G2. This gate G2 outputs the CSL disable control clock signal PCSLD.

FIG. 3 shows the detailed configuration of a unit circuit of the column pre-decoder 180. As shown in FIG. 3, the unit pre-decoder circuit 180' includes inverters IV31–IV49 and NAND gates G34–G49. The unit column pre-decoder circuit 180' is provided with three column address signals CA0–CA2 from the address buffer 160, and generates eight pre-decoded column address signals DCA0–DCA7. The CSL enable control clock signal PCSLE is commonly applied to the first inputs of the NAND gates G42–G49. The second inputs of the NAND gates G42–G49 are provided with the substantial pre-decoded column address signals, i.e., the output signals of the inverters IV34–IV41, respectively. When the PCSLE signal becomes high, the output signals of the inverter IV34–IV41 can be propagated to the inverters IV42–IV49 via the NAND gates G42–G49, respectively, and they are output as the pre-decoded column address signals DCA0–DCA7. The PCSLE signal should go high only after the completion of the pre-decoding operation with the inverters IV31–IV41 and the NAND gates G34–G41 in order to prevent pre-decoding errors.

FIG. 4 illustrates the detailed construction of unit circuits of the column main-decoder 200 and column driver 220, respectively. Referring to FIG. 4, the unit column main-decoder circuit 200' includes NAND gates G50–G57, and inverters IV50–IV57 corresponding to the NAND gates G50–G57, respectively. Each of the NAND gates G50–G57 has one input provided with a corresponding pre-decoded column address signal DCAy (where, y=0, 1, . . . , or 7) and the other input with a gate control signal GCS from a timing control logic (not shown). Each output signal of the NAND gates G50–G57 is provided as a finally decoded signal DCABy (where, y=0, 1, . . . , or 7) through the corresponding inverter IV50, IV51, . . . , or IV57.

The unit column driver circuit 220' includes inverters IV60–IV67, cascode inverters (sometimes called "dual gate inverters") 40–47, and inverting latches 60–67. Each of the cascode inverters 40–47 consists of two PMOS transistors (e.g., MP40a and MP40b) and one NMOS transistor (e.g., MN40), and each inverting latch (e.g., 60) is formed of two cross-coupled inverters (IV60a and IV60b). For each cascode inverter (e.g., 40), three transistors (MP40a, MP40b and MN40) have their source-drain paths coupled in series between a boosted supply voltage terminal VEXT and a ground voltage terminal GND. Each decoded column address signal (e.g., DCAB0) is applied to the gates of the corresponding pull-up and pull-down transistors (MP40a and MN40). The PCSLD signal from the CSL disable control circuit 260 is commonly fed to the gates of the switching transistors MP40b–MP47b of the respective cascode inverters 40–47 via the inverters IV60–IV67. Each inverting latch (e.g., 60) is coupled to the drain junction of the corresponding switching and pull-down transistors (MP60a and MN60).

The pre-decoding operation begins with the CSL disable control clock signal PCSLD of a high level. A pre-decoded column address signal of a high level (e.g., DCA0) can be transferred to the gate of the PMOS transistor MP40a as a decoded column address signal DCAB0 only when the gate control signal GCS remains at a high level. Namely, the GCS signal determines whether to propagate the DCA0–DCA7 signals through the unit column main-decoder circuit 200' or not. The decoded signal DCAB0 goes high when both DCA0 and GCS signals are high, so PMOS pull-up transistor MP40a turns off and NMOS pull-down transistor MN40 on. The high-level DCAB signal is latched by the inverting latch 60, so that a corresponding column select line CSL0 is driven high. After the PCSLD signal has gone low, the GCS signal also goes low. Accordingly, the pull-up transistor MP40a turns on and the pull-down transistor MN40 off, but the column select line CSL0 still remains high owing to the inverting latch 60. In this situation, when the PCSLD signal goes high again, the switching transistor MP40b turns on, so the CSL0 line is driven low.

As described above, the column select lines CSL0–CSLn are selectively activated by the column pre-decoder 180, but deactivated by separately controlling the column driver 220.

FIG. 5 is a timing diagram illustrating read/write operations of the conventional synchronous memory device of FIG. 1. With reference to FIG. 5, after a column address strobe signal $\overline{CAS}$ is activated low, in clock cycle T0, the CSL disable control clock signal PCSLD goes high in synchronism with the external clock signal XCLK (or the internal clock signal PCLK). After a predetermined time (i.e., Tm1) has elapsed, during which the first column address signals CA#0 (i.e., CA0–CAi) have reached the column pre-decoder 180, the CSL enable control clock signal PCSLE goes high in response to the activation of the column address setting signal PYE (see FIG. 2A). Of course, the PCSLE signal is also synchronized with the clock signal XCLK (or PCLK). A unit column pre-decoder circuit 180' pre-decodes the column address signals CA#0 (CA0–CA2) and generates the pre-decoded column address signals DCA#0 (DCA0–DCA7) of which only one is active and the others inactive. Here, assuming DCA0 signal is activated high, then a corresponding column select line CSL0 will be driven high by a unit column driver circuit 220'.

In the next clock cycle T1, the PCSLD signal becomes high before the low-to-high transition of the PCSLE signal, so that the line CSL0 is deactivated. Next, after the second column address signals CA#1 (CA0–CA2) had reached the unit column pre-decoder circuit 180' and the time Tm1 has elapsed, when the CSL enable control clock signal PCSLE goes high again in response to the activation of the column address setting signal PYE. The unit column pre-decoder circuit 180' generates the second decoded column address signals DCA#1 (DCA0–DCA7). Here, assuming DCA1 signal is activated high, then a corresponding line CSL1 will be driven high by a unit column driver circuit 220'.

The other column select lines (such as CSL2 and CSL3) also will become activated and deactivated during next clock cycles (T2 and T3) in response to the other column address signals (such as CA#2 and CA#3) in the same manner as the above-mentioned.

In the above conventional memory device, the CSL enable control clock PCSLE should not go active until valid column address signals arrive at the pre-decoder 180 during each clock cycle Tc (where, c=0, 1, 2, . . . ). However, in the event the PCSLE signal goes high during a clock cycle (e.g., T1) before the valid column address signals CA#1 arrive at the column pre-decoder 180, owing to an insufficient delay time of Tm1, then the invalid column address signal CA#0 for the previous clock cycle T0 may be pre-decoded again by the corresponding column pre-decoder circuit 180' (refer to FIG. 3). Hence, the invalid decoded signal DCAB0 will be latched by the corresponding inverting latch 60 via the cascode inverter 40 (refer to FIG. 4). This leads to the activation of the column select line CSL0. Thereafter, when the valid decoded signal DCAB1 is activated by decoding the valid column address signals CA#1 and latched by a corresponding inverting latch 41 in cycle T1, the column select line CSL1 corresponding to the valid column address signals CA#1 also becomes active along with the invalid CSL0 line, causing an erroneous read/write operation. For the above reason, it is essential to ensure sufficient delay time Tm1 in the conventional memory device. This limits the memory access speed improvements.

In addition, according to the conventional memory device structure, a significant area penalty may result from the large reiterative layout area of the unit column driver circuit 220'.

Furthermore, since the pull-up and switching transistors MP40a–MP47a and MP40b–MP47b within the respective cascode inverters 40–47 provide current leakage paths together with the inverters IV60b–IV67b of the inverting latches 60–67 during power-up, the conventional device has large power-up current dissipation.

SUMMARY OF THE INVENTION

The present invention is therefore directed to providing a synchronous semiconductor memory device and associated methods which substantially overcomes one or more of the problems due to the limitations and disadvantages of the related art.

Accordingly, an object of the present invention is to provide a synchronous semiconductor memory device having an improved column selection circuit structure suitable for performing a data accessing at high speed.

It is another object of the present invention to provide a synchronous semiconductor memory device having less power-up current dissipation than the conventional memory.

It is still another object of the present invention to provide a synchronous semiconductor memory device having a smaller area than the conventional synchronous memory.

These and other objects, advantages and features of the present invention may be realized by providing synchronous semiconductor memory devices which include a column main-decoder circuit that is directly coupled to column select lines and selectively drives the column select lines in response to pre-decoded column address signals, and a preferred CSL timing controller that controls both enable timing and disable timing of the column select lines by controlling the column pre-decoder in synchronism with a reference clock signal. Preferably, an externally applied clock signal serves as the reference signal. The preferred CSL timing controller generates a CSL timing control signal representative of the enable timing and the disable timing of the column select lines in synchronism to the reference clock signal. The column pre-decoder is either enabled or disabled depending upon logic states of the CSL timing control signal.

According to a preferred aspect of the present invention, the CSL timing controller includes a first control circuit which provides a CSL enable control signal representative of the enabling timing of the column select lines in synchronism with the reference clock signal, a CSL disable control circuit which provides a CSL disable control signal representative of the disable timing of the column select lines in synchronism with the reference clock signal, and a flip-flop circuit which has first and second inputs for receiving the CSL enable and disable control signals, respectively, and an output for providing the CSL timing control signal. Preferably, a latch logic with NOR gates is used to build the flip-flop circuit. Alternatively, the latch logic may be constructed from NAND gates.

These and other objects, advantages and features of the present invention may also be realized by providing a method of operating an integrated circuit semiconductor memory device in synchronism with a reference signal. The method includes pre-decoding column address signals, selectively driving column select lines in response to pre-decoded column address signals, and controlling both enable timing and disable timing of the column select lines by controlling the column pre-decoder in synchronism with the reference clock signal. Preferably, an externally applied clock signal serves as the reference signal. The preferred controlling includes generating a CSL timing control signal representative of the enable timing and the disable timing of the column select lines in synchronism to the reference clock signal. The column pre-decoder is either enabled or disabled depending upon logic states of the CSL timing control signal. Preferably, the CSL timing control signal is generated even absent the arrival of a valid column address signal. Preferably, the column select lines and the pre-decoded column address signals when the signals are inactivated when the CSL timing control signals is inactive.

According to the present invention, the conventional column driver occupying a large layout area is unnecessary, so that there is a large area savings as well as reducing total power consumption. In addition, since there is no need to always enable the column predecoder after the arrival of the column address signals thereto, it is possible to give a better access speed.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like or similar reference symbols denote like or similar components, wherein:

FIG. 10 is a timing diagram for the read/write operations of the memory device of FIG. 6.

DETAILED DESCRIPTION OF THE PREFERRED EMBODIMENTS

The present invention relates to an improvement in selecting the columns of synchronous semiconductor memory devices. In the following description, specific details are set forth to provide a thorough understanding of the present invention. However, it will be obvious to those skilled in the art that the present invention may be practiced without these particulars. In other instances, well-known elements have not been shown or described to avoid unnecessarily obscuring the present invention. Accordingly, the specification and drawings are to be regarded in an illustrative, rather than a restrictive, sense.

A preferred embodiment of the present invention will now be described with reference to FIG. 6 through FIG. 10.

Figure 1:
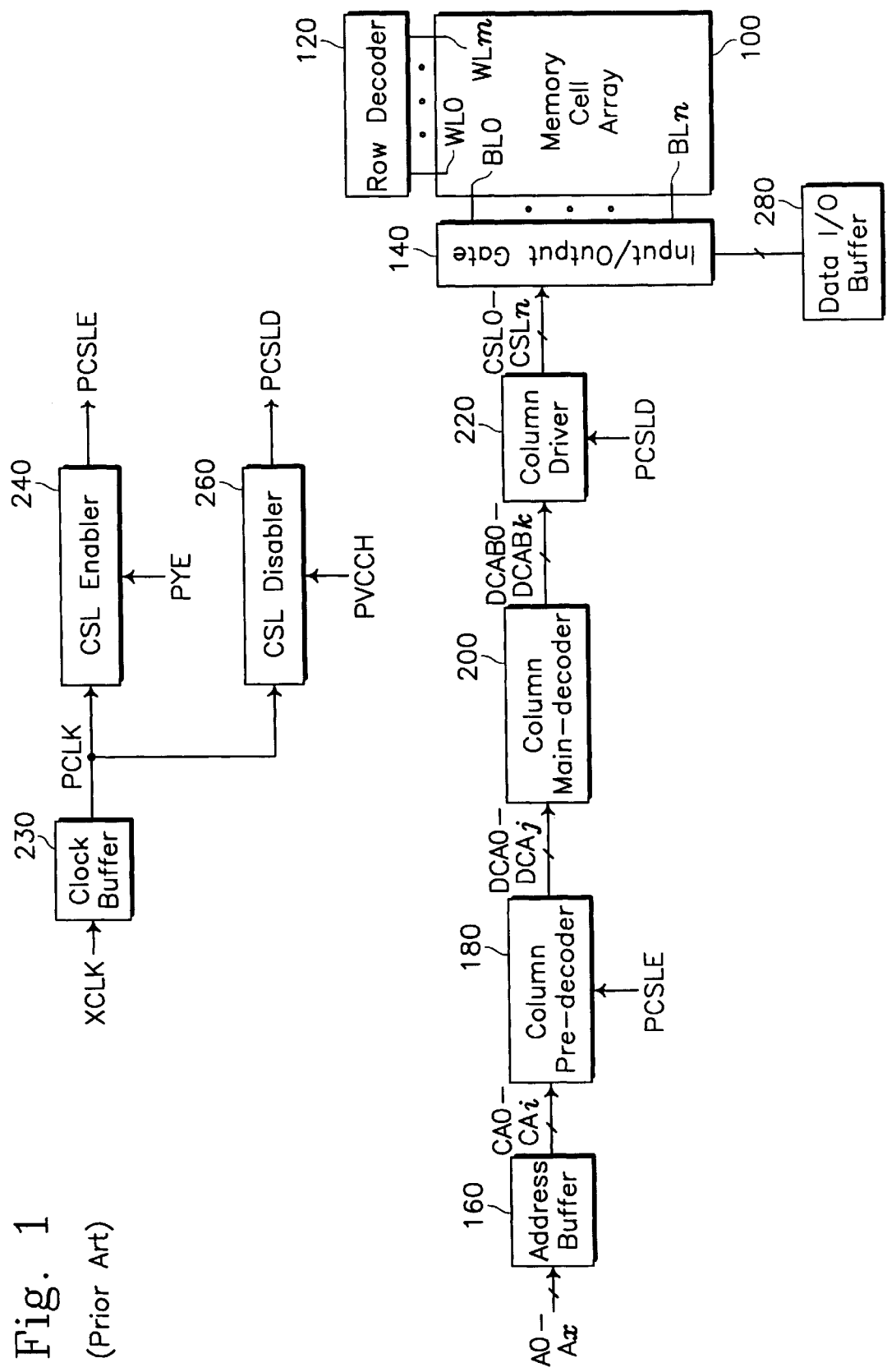
FIG. 1 is a block diagram illustrating a conventional synchronous memory device.
Figure 2A:
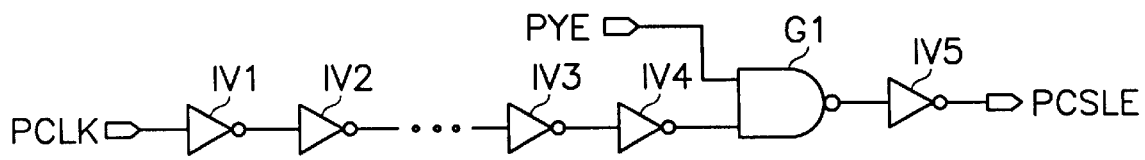
FIG. 2A is a detailed circuit diagram of the CSL enable control circuit of FIG. 1.
Figure 2B:
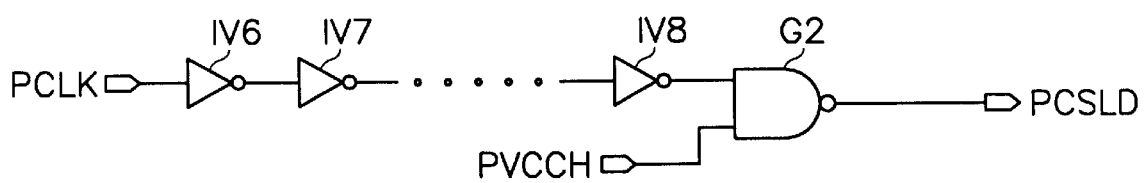
FIG. 2B is a detailed circuit diagram of the CSL disable control circuit of FIG. 1.
Figure 3:
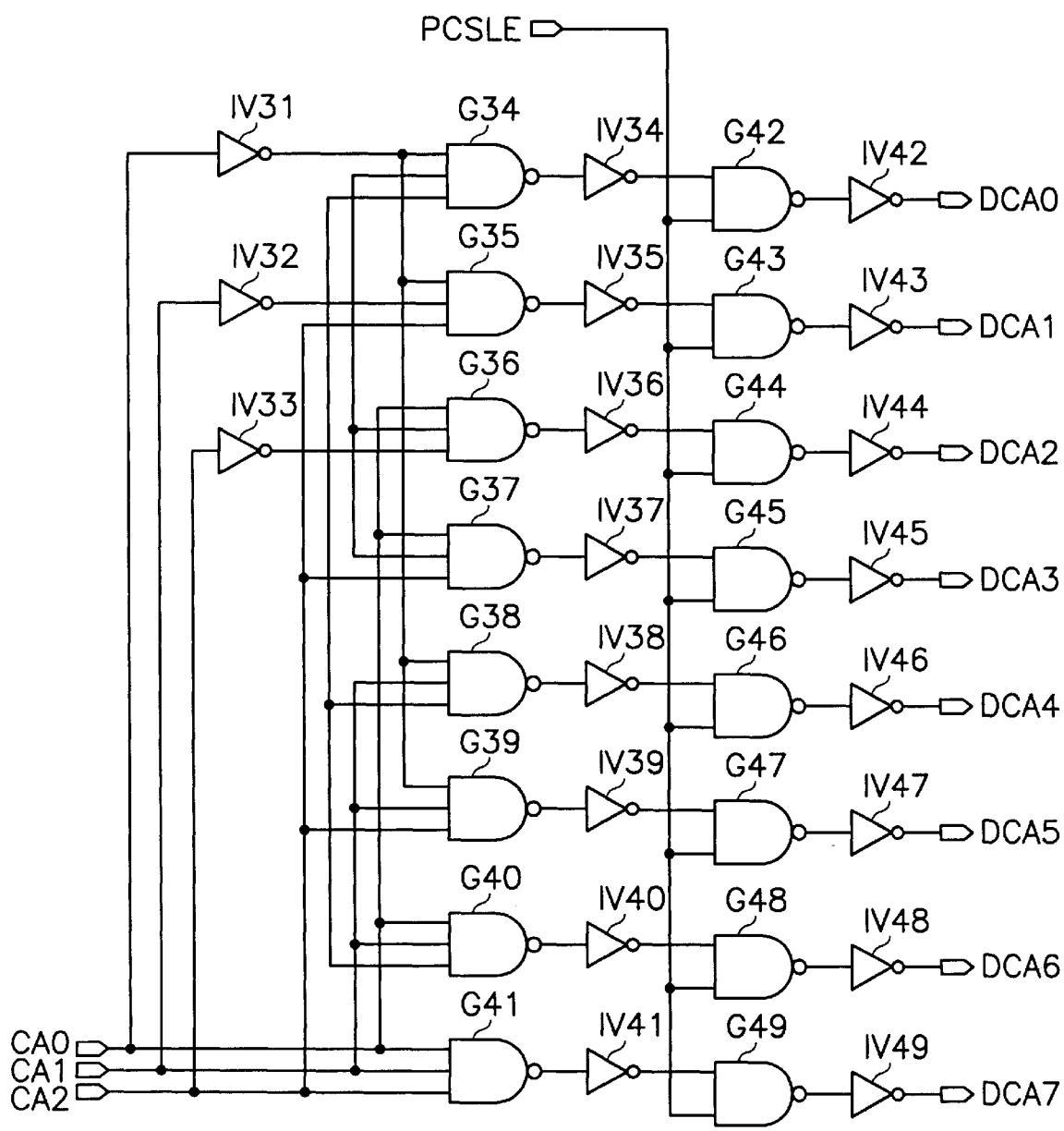
FIG. 3 is a detailed circuit diagram of the column pre-decoder of FIG. 1.
Figure 4:
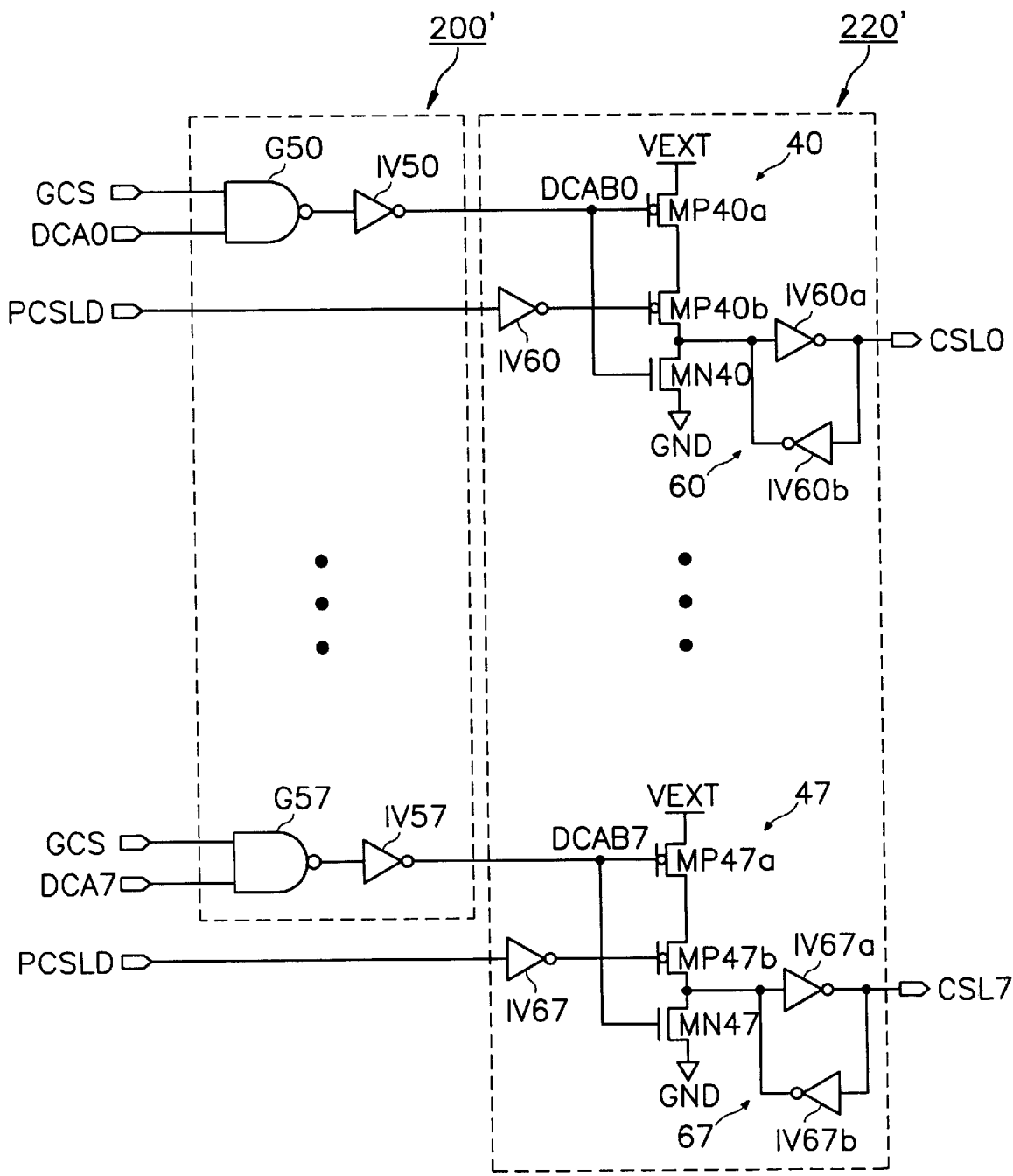
FIG. 4 is a detailed circuit diagram of the column main-decoder and the column driver of FIG. 1.
Figure 5:
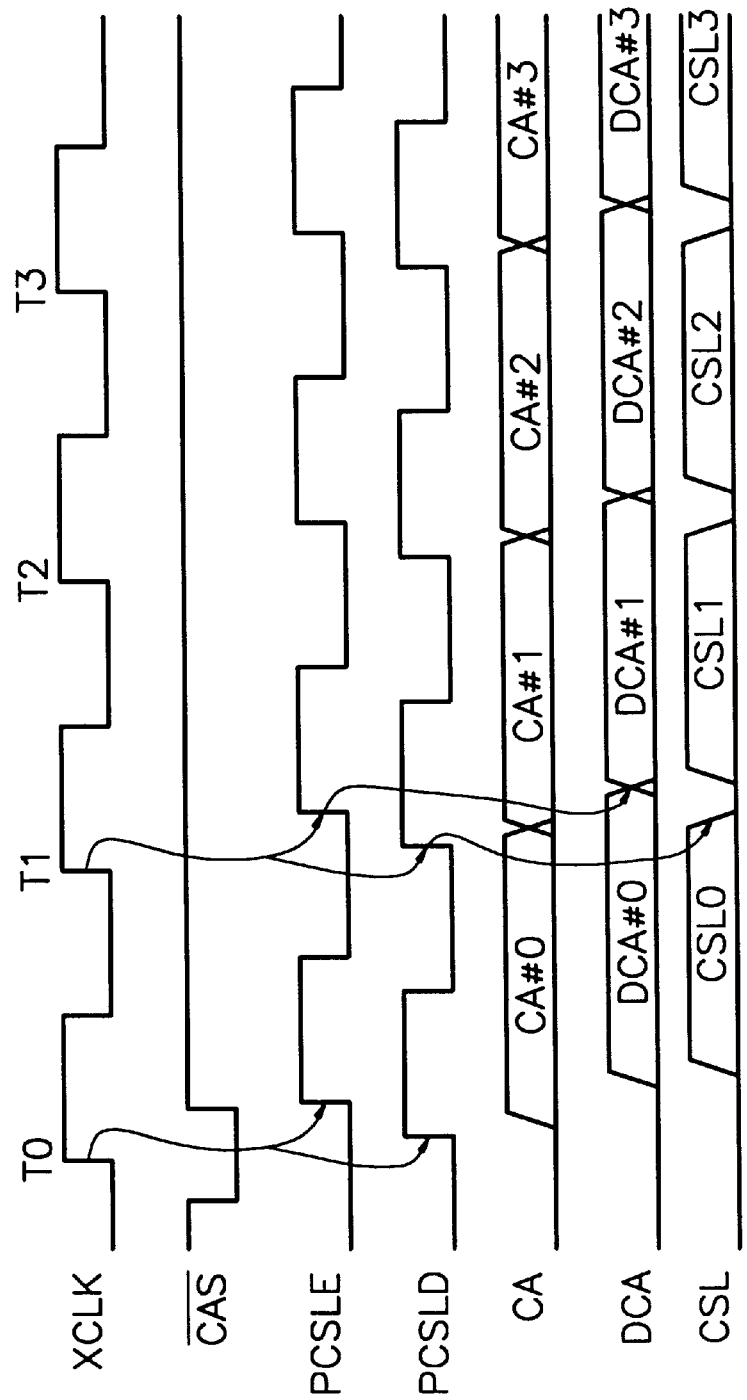
FIG. 5 is a timing diagram for the read/write operations of the memory device of FIG. 1.
Figure 6:
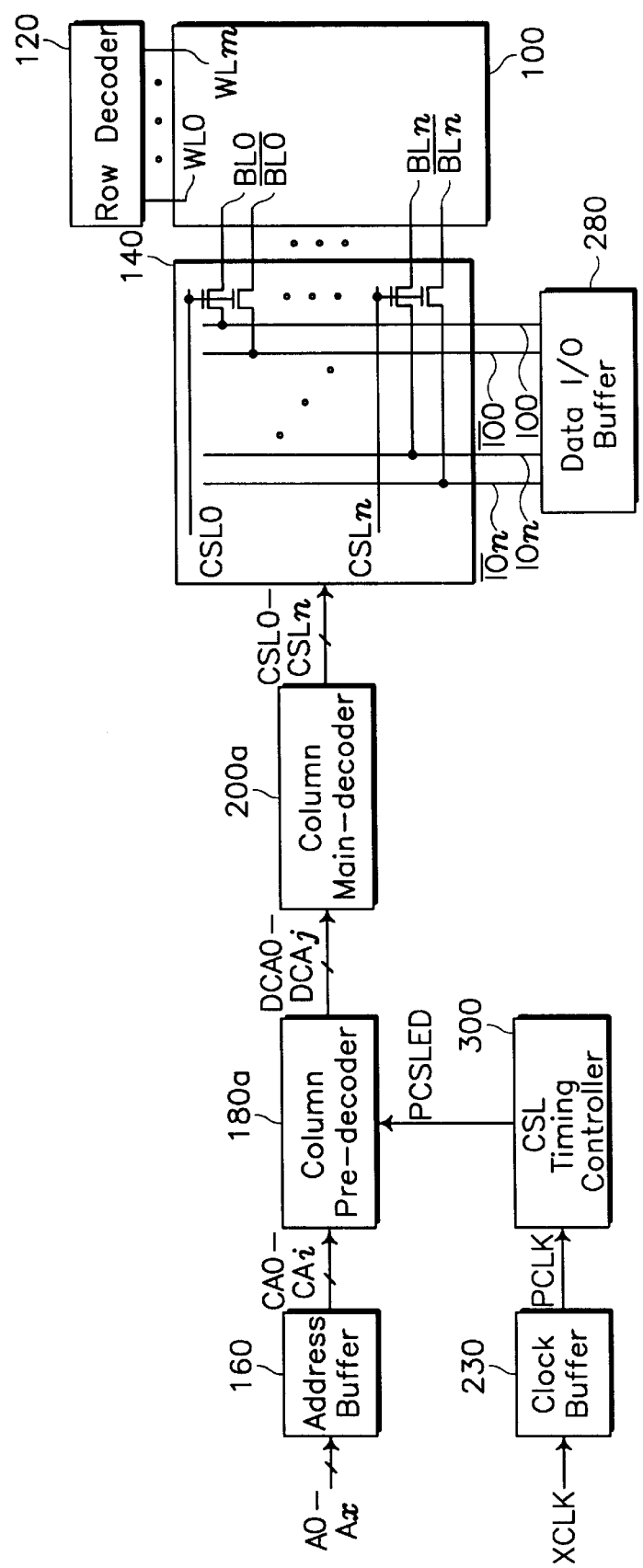
FIG. 6 is a block diagram illustrating an embodiment of a synchronous memory device according to the present invention.

Referring first to FIG. 6, a synchronous semiconductor memory device according to an embodiment of the present invention is shown. An array 100 of memory cells (not seen), such as DRAM cells, SRAM cells, non-volatile memory cells, is provided to store data. Word lines WL0–WLm and bit lines BL0–BLn, $\overline{BL0}$–$\overline{BLn}$, coupled with the cells, run along the rows and columns of the memory cell array 100, respectively. In the vicinity of the cell array 100, a row decoder 120 is provided for selectively driving the word lines WL0–WLm, and an input/output (I/O) gate circuit 140 for supporting the selective transmission of data from the bit lines BL0–BLn, $\overline{BL0}$–$\overline{BLn}$ to a data I/O buffer 280 through I/O data lines IO0–IOn, $\overline{IO0}$–$\overline{IOn}$, and vice versa. The I/O gate circuit 140 is controlled by column select lines CSL0–CSLn. Externally applied address signals A0–Ax for the selection of specific memory cell(s), including row address signals and column address signals, are fed to an address buffer 160. A column pre-decoder 180a is applied with the column address signals CA0–CAi from the address buffer 160 and generates pre-decoded column address signals DCA0–DCAj. The column main-decoder 200a is directly coupled to the column select lines CSL0–CSLn and selectively drive them in response to the pre-decoded column address signals DCA0–DCAj.

An external clock signal XCLK is also input to a clock buffer 230. This buffer 230 produces an internal PCLK synchronized with the external clock signal XCLK. A CSL timing controller 300 generates a CSL timing control signal PCSLED. This signal PCSLED is used to control enable timing and disable timing of the column pre-decoder 180a. Specifically, the pre-decoder 180a outputs the pre-decoded column address signals DCA0–DCAj when the PCSLED signal becomes active, but not when inactive. In other words, one of the signals DCA0–DCAj becomes active when the PCSLED signal is active, so that one of the CSL0–CSLn lines is driven active by the column-main decoder 200a. But, with inactivation of the PCSLED signal, all of the CSL0–CSLn lines are driven inactive because all the DCA0–DCAj signals are rendered inactive. This unified CSL enable/disable control manner of the invention makes it possible to eliminate the column driver, reducing chip area.

Figure 7:
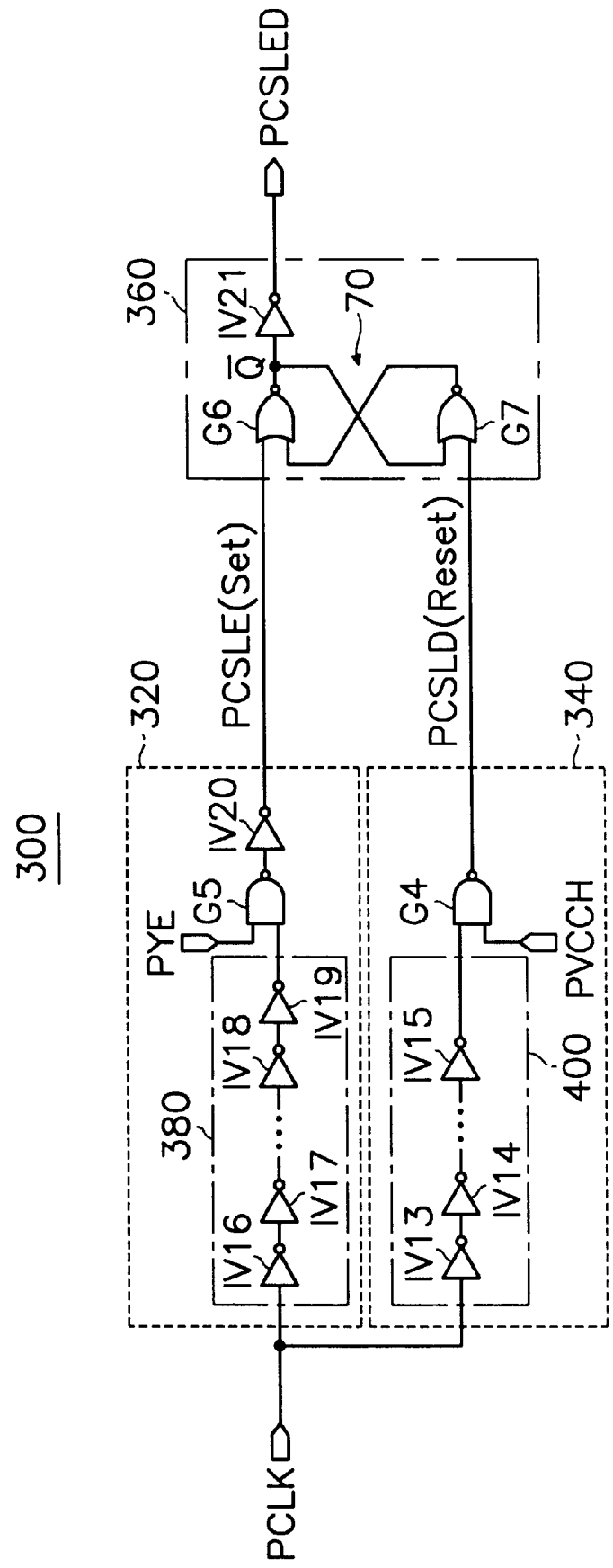
FIG. 7 is a detailed circuit diagram of the CSL timing controller of FIG. 6.

With particular reference to FIG. 7, the CSL timing controller 300 includes a CSL enable control circuit 320, a CSL disable control circuit 340, and a flip-flop circuit 360. The CSL enable control circuit 320 is constructed with a delay circuit 380 consisting of inverters IV16–IV19, NAND gate G5, and an inverter IV20. The internal clock signal PCLK is delayed by the delay circuit 380. One input of the NAND gate G5 is supplied with this delayed clock signal and the other input is supplied with a column address setting signal PYE from another internal timing control logic (not seen). The output signal of the NAND gate G5 is output via the inverter IV20 as an CSL enable control clock signal PCSLE.

The CSL disable control circuit 340 includes a delay circuit 400 formed of inverters IV13–IV15 and a NAND gate G4. The delay circuit 400 is also supplied with the clock signal PCLK. This delay circuit 400 has a smaller delay time than the delay circuit 380 within the CSL enable control circuit 320. One input of the NAND gate G4 is supplied with the output of the delay circuit 400 and the other input is supplied with normally logic-high signals PVCCH. This gate G4 outputs the CSL disable control clock signal PCSLD.

The flip-flop circuit 360 includes an S(set)-R(reset) latch logic 70 with NOR gates G6 and G7. The latch logic 70 maintains a given logic condition until changed by inputs. There are two inputs to the latch logic 70; one is "Set" and the other is "Reset". The CSL enable control clock signal PCSLE is supplied to the Set input of the latch logic 70 and the CSL disable control clock signal PCSLD to the Reset input thereof. The latch logic 70 has an inverting output $\overline{Q}$. This $\overline{Q0}$ signal is provided through an inverter IV21 as the CSL timing control signal PCSLED. When the PCSLD becomes high ("1"), the $\overline{Q}$ signal goes high ("1") as long as the PCSLE remains low ("0"). If the PCSLE signal goes high while the PCSLD signal is maintained low, then the $\overline{Q}$ signal goes low ("0"). When both of the signals PCSLE and PCSLD are low, the $\overline{Q}$ signal remains low. Conversely, when the PCSLE and PCSLD both are high, the $\overline{Q}$ signal remains high.

Figure 8:
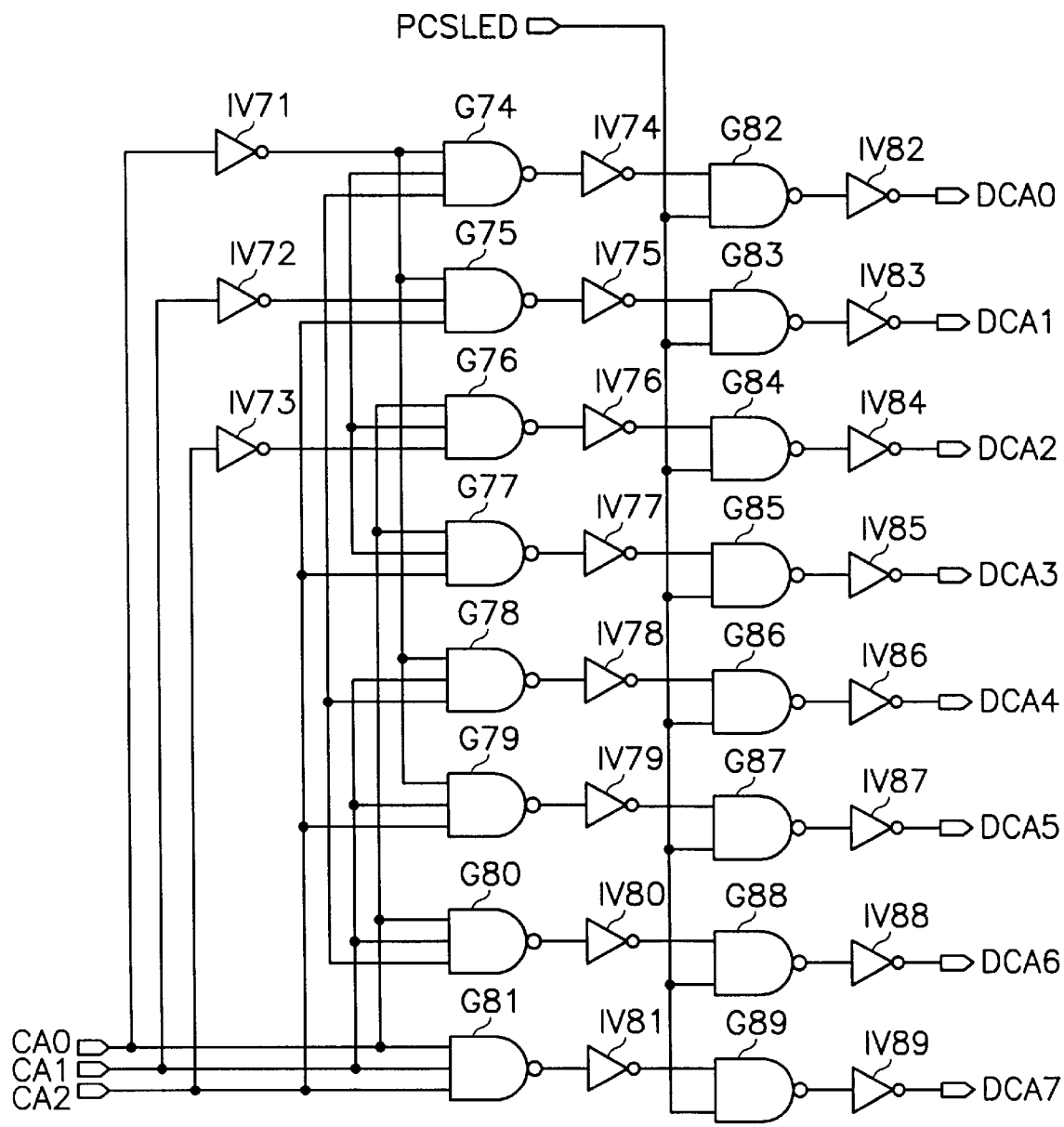
FIG. 8 is a detailed circuit diagram of the column pre-decoder of FIG. 6.

Referring next to FIG. 8, the detailed configuration of a unit circuit of the column pre-decoder 180a is shown. The unit pre-decoder circuit 180a' includes inverters IV71–IV89 and NAND gates G74–G89. The unit column pre-decoder circuit 180a' is provided with three column address signals CA0–CA2 from the address buffer 160, and generates eight pre-decoded column address signals DCA0–DCA7. The CSL timing control clock signal PCSLED is commonly applied to the first inputs of the NAND gates G82–G89. The second inputs of the NAND gates G82–G89 are provided with the substantial pre-decoded column address signals, i.e., the output signals of the inverters IV74–IV81, respectively. When the PCSLED signal becomes high, the output signals of the inverter IV74–IV81 can be propagated to the inverters IV82–IV89 via the NAND gates G82–G89, respectively, and they are output as the pre-decoded column address signals DCA0–DCA7.

Figure 9:
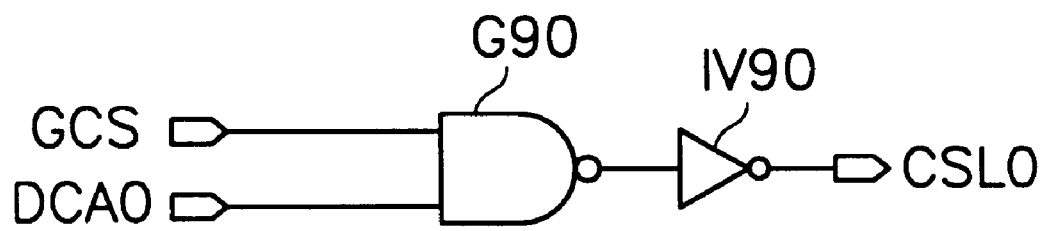
FIG. 9 is a detailed circuit diagram of the column main-decoder of FIG. 6.
Figure 9:
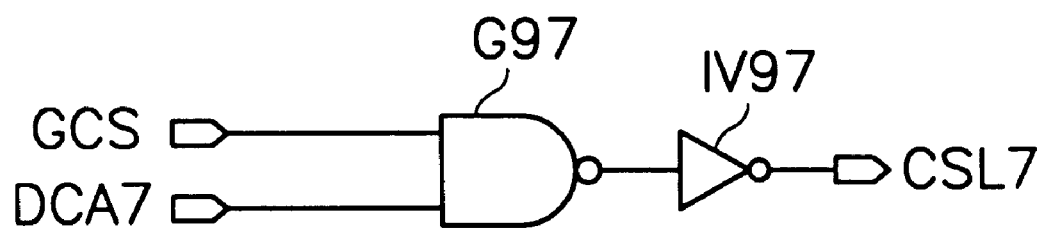

FIG. 9 is a detailed construction of a unit circuit of the column main-decoder 200a. The unit column main-decoder circuit 200a' includes NAND gates G90–G97, and inverters IV90–IV97. First inputs of the NAND gates G90–G97 are supplied with gate control signal GCS from a timing control logic (not shown) and the others thereof with the pre-decoded column address signals DCA0–DCA7, respectively. The output signals of the NAND gates G90–G97 are provided to the inverters IV90–IV97, respectively. The output signals of the inverters IV90–IV97 drives the respective column select lines CSL0–GSL7.

FIG. 10 is a timing diagram illustrating read/write operations of the synchronous memory device of FIG. 6. Referring to FIG. 10, after a column address strobe signal $\overline{CAS}$ is activated low, in clock cycle T0, the CSL disable control clock signal PCSLD goes high in synchronism with the external clock signal XCLK (or the internal clock signal PCLK). So, the CSL timing control clock signal PCSLED remains low. Next, the CSL enable control clock signal PCSLE goes high in response to the activation of the column address setting signal PYE (see FIG. 7), so that the PCSLED signal changes to a high level. The logic condition of the PCSLED signal is maintained by the flip-flop circuit 360 till the low-to-high transition of the PCSLD signal. As a result of this, a unit column pre-decoder circuit 180a' pre-decodes the column address signals CA#0 (CA0–CA2) and outputs the pre-decoded column address signals DCA#0 (DCA0–DCA7) of which only one is active and the others inactive. Here, assuming DCA0 signal is activated high, then a corresponding column select line CSL0 will be driven high by a unit column main decoder circuit 200a'.

In the next clock cycle T1, the PCSLD signal becomes high again before the low-to-high transition of the PCSLE signal. Thus, the PCSLED signal goes low, so that the line CSL0 is deactivated.

The other CSL lines (such as CSL1–CSL3) also will become activated and deactivated during next clock cycles (T1–T3) in response to the other column address signals (such as CA#1–CA#3) in the same manner as the above-mentioned.

The PCSLED signal is able to go high even though valid column address signals do not reach the pre-decoder 180*a*' (see Tm2 of FIG. 10). This is because, with the removal of the column driver, the invalid decoded signal is not latched. Further, an invalid pre-decoded column address signal is disabled as soon as the valid column signals arrive at the pre-decoder 180*a*'. Since the CSL enable timing is not limited by the arrival of valid column address signals, this column selection can give a significant improvement in accessing speed.

As described above, according to the present invention, the conventional column driver occupying a large layout area is unnecessary, so that there is a large area saving, as well as a reduced power-up current dissipation. In addition, since there is no need to always enable the column pre-decoder after the arrival of the column address signals thereto, it is possible to give a better access speed.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

What is claimed is:

1. An integrated circuit semiconductor memory device operating in synchronism with a reference clock signal, comprising:

a column pre-decoder for pre-decoding column address signals;

a column main-decoder coupled to column select lines (CSL), for selectively driving column select lines in response to pre-decoded column address signals; and a controller for controlling both enable timing and disable timing of the column select lines by controlling the column pre-decoder in synchronism with the reference clock signal, wherein said controller generates a CSL timing control signal representative of the enable timing and the disable timing of the column select lines in synchronism with the reference clock signal; and wherein the column pre-decoder is either enabled or disabled depending upon logic sates of the CSL timing control signal.

2. The memory device of claim 1, wherein the reference clock signal is applied externally.

3. An integrated circuit semiconductor memory device operating in synchronism with an external clock signal, comprising:

a column pre-decoder for pre-decoding column address signals;

a column main-decoder coupled to column select lines (CSL), for selectively driving the column select lines in response to pre-decoded column address signals; and a controller for controlling enable timing and disable timing of the column select lines by enabling/disabling the column pre-decoder in synchronism with the external clock signal, wherein the controller generates a CSL timing control signal representative of the enable timing and the disable timing of the column select lines in synchronism with the external clock signal; wherein the controller comprises a first control circuit for providing a CSL enable control signal representative of the enabling timing of the column select lines in synchronism with the external clock signal, a CSL disable control circuit for providing a CSL disable control signal representative of the disable timing of the column select lines in synchronism with the external clock signal, and a flip-flop circuit having first and second inputs for receiving the CSL enable and disable control signals, respectively, and an output for providing the CSL timing control signal.

4. The memory device of claim 3, wherein the flip-flop circuit comprises a latch logic with NOR gates.

5. A method of operating an integrated circuit semiconductor memory device in synchronism with a reference clock signal, comprising:

pre-decoding column address signals;

selectively driving column select lines (CSL) in response to pre-decoded column address signals; and controlling both enable timing and disable timing of the column select lines by controlling the pre-decoding in synchronism with the reference clock signal, wherein the controlling includes generating a CSL timing control signal representative of the enable timing and the disable timing of the column select lines in synchronism with the reference clock signal; and wherein the column address signals are either enabled or disabled depending upon logic sates of the CSL timing control signal.

6. The method of claim 5, further comprising applying the reference clock signal externally.

7. The method of claim 5, wherein the generating of a CSL timing control signal occurs even absent arrival of a valid column address signal.

8. The method of claim 5, further comprising inactivating the column select lines and the pre-decoded column address signals when the CSL timing control signal is inactive.

* * * * *